(12) United States Patent
Ngo et al.

(10) Patent No.: US 6,940,312 B2
(45) Date of Patent: Sep. 6, 2005

(54) LOW SWITCHING POWER LIMITED SWITCH DYNAMIC LOGIC

(75) Inventors: Hung C. Ngo, Austin, TX (US); Jente B. Kuang, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 48 days.

(21) Appl. No.: 10/733,936

(22) Filed: Dec. 11, 2003

(65) Prior Publication Data

US 2005/0127949 A1  Jun. 16, 2005

(51) Int. Cl.[7] .......................................... H03K 19/096
(52) U.S. Cl. .............................. 326/95; 326/97; 326/98
(58) Field of Search .................................... 326/93–98

(56) References Cited

U.S. PATENT DOCUMENTS 6,496,038 B1 * 12/2002 Sprague et al. ................ 326/95
6,717,442 B2 *  4/2004 Campbell ...................... 326/95

* cited by examiner

*Primary Examiner*—Anh Q. Tran
(74) *Attorney, Agent, or Firm*—Richard F. Frankeny; Winstead Sechrest & Minick P.C.; Casimer K. Salys

(57) ABSTRACT

An LSDL circuit is improved by having the data input function to control the pre-charging of the dynamic node. The clock signal no longer is coupled to the P channel FET used to pre-charge the dynamic node. Additionally an N channel FET (NFET) is added in parallel with the NFET coupled to the clock for evaluating the dynamic node. This NFET assures the dynamic node does not float when the data input is a logic one and the clock is a logic zero.

20 Claims, 9 Drawing Sheets

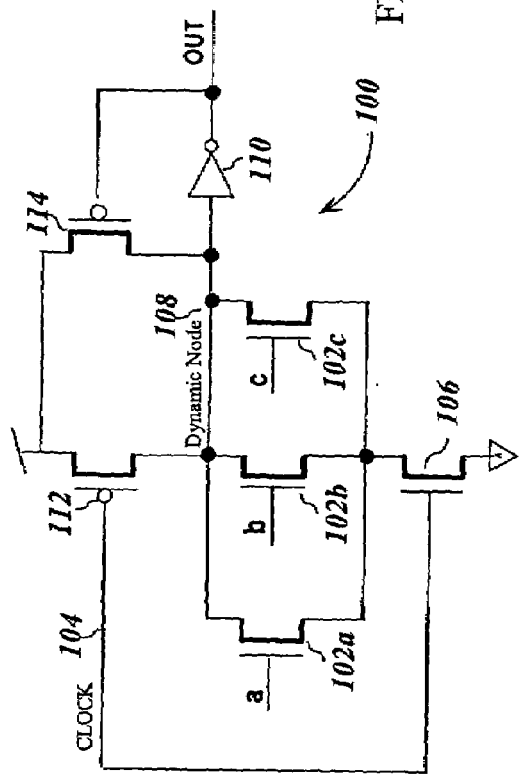
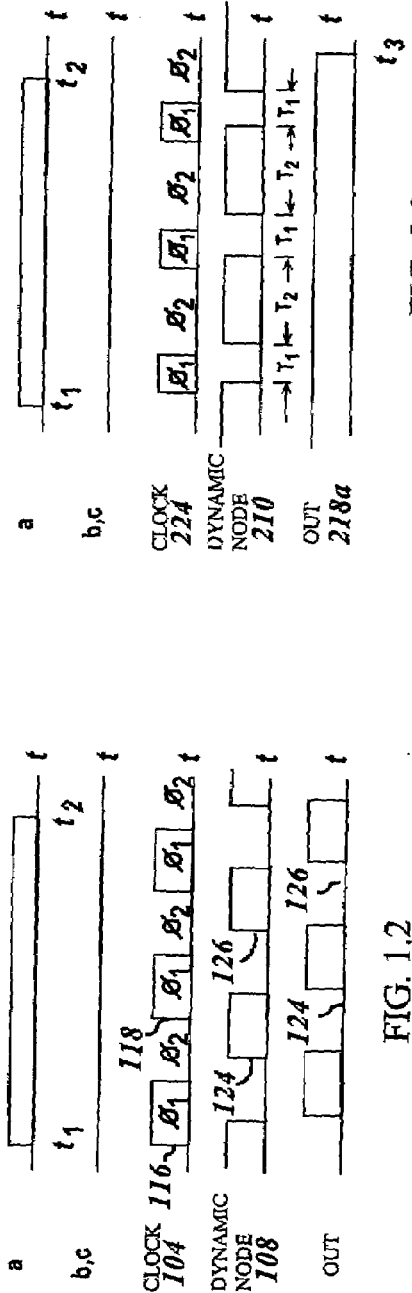
FIG. 1.1
FIG. 1.2
FIG. 2.3

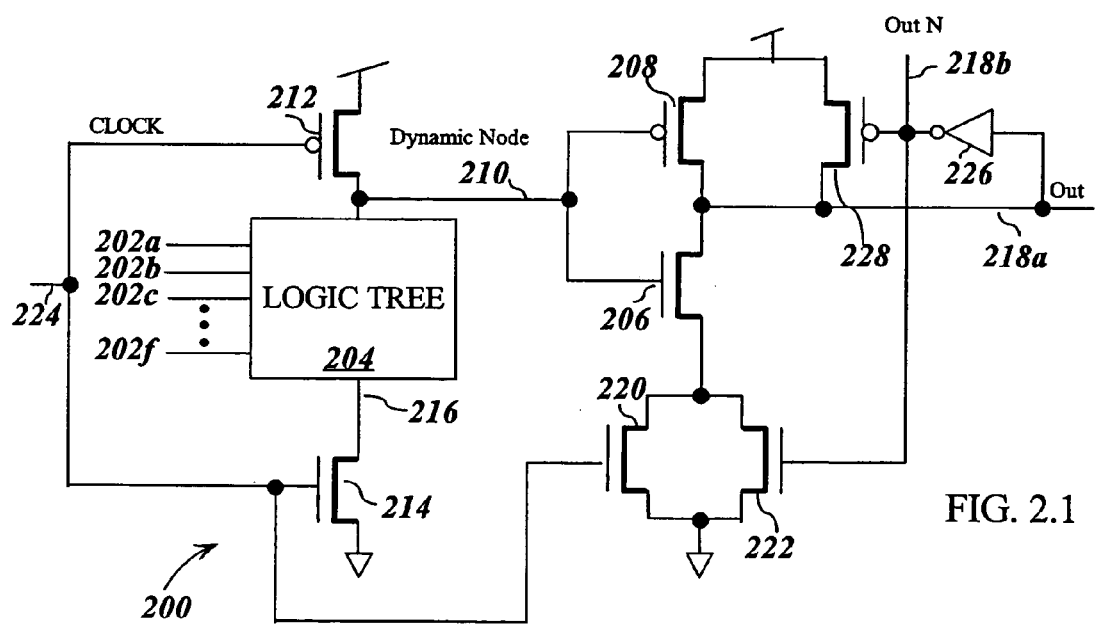
FIG. 2.1
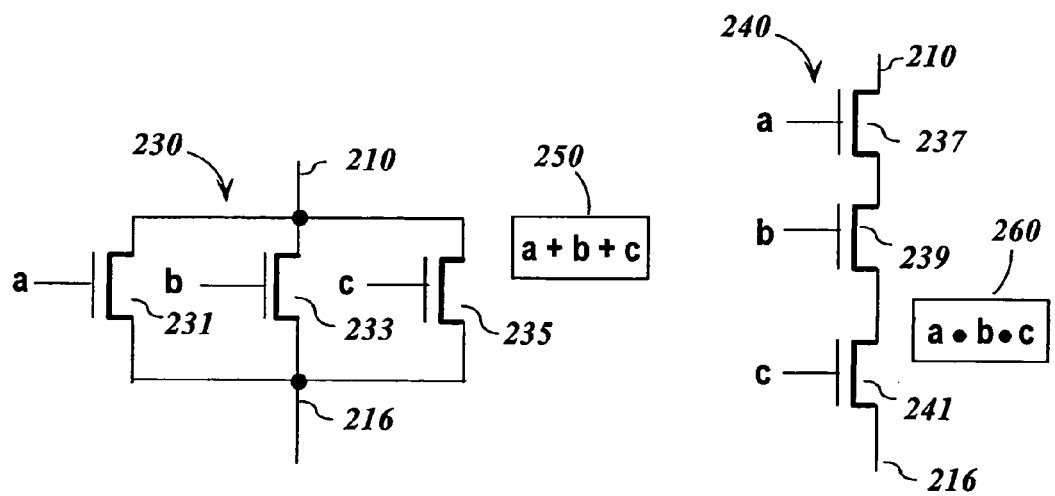
FIG. 2.2.1
FIG. 2.2.2

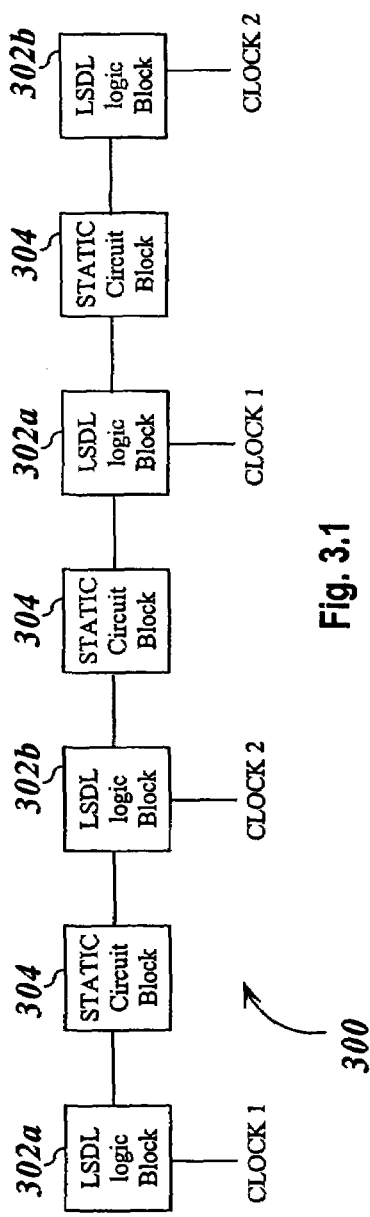
Fig. 3.1
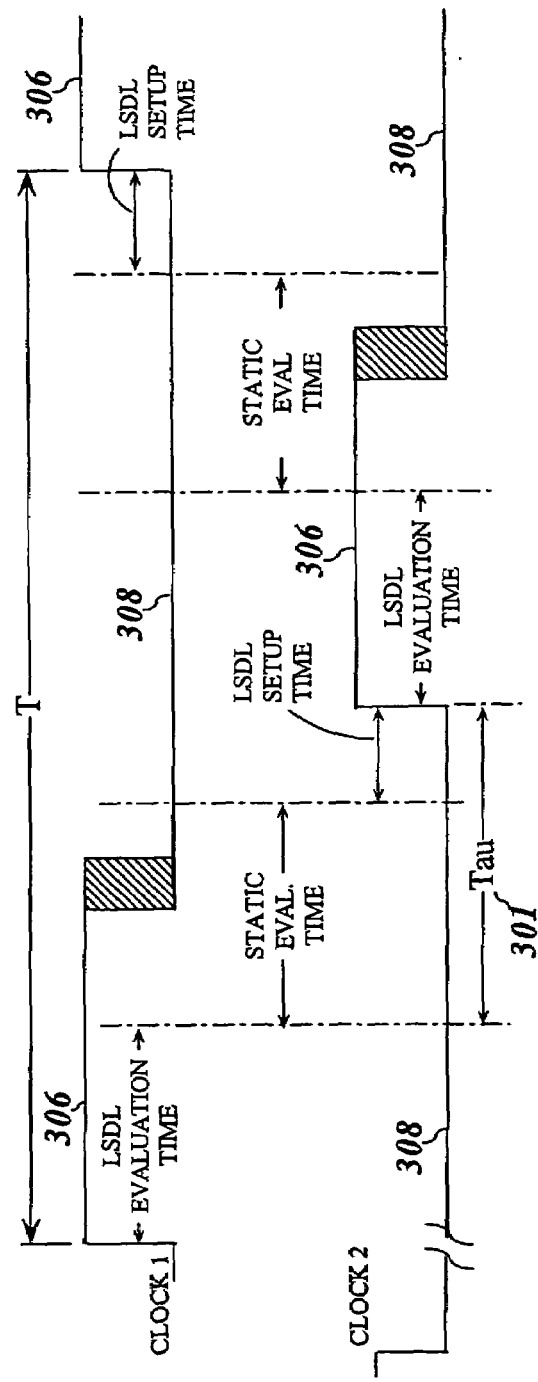
FIG. 3.2

LOW SWITCHING POWER LIMITED SWITCH DYNAMIC LOGIC

CROSS REFERENCE TO RELATED APPLICATION

The present invention is related to U.S. patent application Ser. No. 10/116,612, filed Apr. 4, 2002, entitled "CIRCUITS AND SYSTEMS FOR LIMITED SWITCH DYNAMIC LOGIC," which is incorporated by reference herein.

TECHNICAL FIELD

The present invention relates in general to metal oxide silicon (MOS) dynamic logic circuits.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock, each cycle may consume power even when the logical value of the output is otherwise unchanged.

This may be appreciated by referring to FIG. 1.1 illustrating an exemplary three-input OR dynamic logic gate, and the accompanying timing diagram, FIG. 1.2. Dynamic logic 100 includes three inputs a, b and c coupled to a corresponding gate of NFETs 102a–102c. During an evaluate phase $N_1$ (116) of clock 104, NFET 106 is active, and if any of inputs a, b or c are active, dynamic node 108 is pulled low, and the output OUT goes "high" via inverter 110. Thus, referring to FIG. 1.2, which is illustrative, at $t_1$, input a goes high during a precharge phase $N_2$ of clock 104. During the precharge phase $N_2$ of clock 104, dynamic node 108 is precharged via PFET 112. Half-latch PFET 114 maintains the charge on dynamic node 108 through the evaluate phase, unless one or more of inputs a, b or c is asserted. In the illustrative timing diagrams in FIG. 1.2, input a is "high" having a time interval $t_1$ through $t_2$ that spans approximately 2½ cycles of clock 104, which includes evaluation phases, 116 and 118. Consequently, dynamic node 108 undergoes two discharge-precharge cycles, 124 and 126. The output node similarly undergoes two discharge-precharge cycles, albeit with opposite phase, 124 and 126. Because the output is discharged during the precharge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Limited switching dynamic logic (LSDL) circuits produce circuits which mitigate the dynamic switching factor of dynamic logic gates with the addition of static logic devices which serve to isolate the dynamic node from the output node. Co-pending U.S. patent application entitled, "CIRCUITS AND SYSTEMS FOR LIMITED SWITCH DYNAMIC LOGIC," Ser. No. 10/116,612 filed Apr. 4, 2002 and commonly owned, recites such circuits. Additionally, LSDL circuits and systems maintain the area advantage of dynamic logic over static circuits, and further provide both logic senses, that is, the output value and its complement.

A logic buffer is a logic circuit that isolates or "buffers" a logic signal. It may be used to increase the fan-out of a logic signal. In some cases, a buffer also inverts the logic signal, thus a logic inverter may be thought of as an inverting buffer. As with standard logic functions, there may be static and clocked buffers. The LSDL logic technology uses both static devices and LSDL logic devices. In standard LSDL, a buffer is realized by replacing the logic tree with a single device. In this way, a logic signal coupled to the data input is clocked into the LSDL buffer and a latched output and its inversion are generated. Because there are a large number of buffers used in any modern integrated circuit (IC) design, buffers are key and perhaps the primary power contributors in any logic design. This is equally true for LSDL designs.

There is, therefore, a need for an LSDL buffer design that maintains all of the LSDL circuit advantages over other dynamic logic while reducing the dynamic power dissipated.

SUMMARY OF THE INVENTION

An improved LSDL buffer circuit modifies the role of the clock input and the data input relative to the input stage. In an LSDL logic circuit with more than one input and an output that is a logic combination of the inputs, there is an assumption that the logic function, on average, is a logic one 50% of the time and a logic zero 50% of the time. If the dynamic node is pre-charged to a logic one during one phase of the clock and the logic function is evaluated during the second phase of the clock, performance usually increases since 50% of the time the evaluation state does not change. The clock in LSDL circuits does change state every cycle; its only variations are in frequency and duty cycle. The employment of complementary devices eliminates static power dissipation, however, dynamic or switching power is directly related to clock frequency and the total capacitance that is switched each clock cycle. In a standard LSDL buffer, the clock is coupled to three field effect transistor (FET) devices, the pre-charge P channel FET (PFET) and two N channel FETs (NFETs) used to evaluate the logic state of the input. The input stage has one PFET for pre-charging the dynamic node and two NFETs, one NFET coupled to the data input and one NFET used to evaluate the state of the data input. Functionally, the two NFETs perform the same. The clock is normally coupled to the gate of the pull-up (pre-charge) PFET connected to the positive power supply rail and to the gate of the pull-down NFET connected to the negative (ground) power supply rail. The improved LSDL buffer couples the data input to the gates of the pull-up PFET and the middle NFET used to generate the logic state of the data input signal. In this way, one of the clock loads is eliminated and the clock load per LSDL buffer is reduced. Since the clock is always the highest switching rate signal in any logic circuit, this causes a reduction in clock switching power. Reduction occurs because the PFET is a large device, the clock is the highest frequency signal, and by the fact that the wiring necessary to couple together three FET devices is reduced, which also reduces parasitic capacitances further reducing switching power. An additional NFET is added in parallel with the input stage pull-down NFET coupled to ground. This NFET assures that the dynamic node does not float when the clock is a logic zero and the data input goes to a logic one.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 1.1 illustrates, in partial schematic form, a dynamic logic gate which may be used in conjunction with the present invention;

FIG. 1.2 illustrates a timing diagram corresponding to the logic gate embodiment illustrated in FIG. 1.1;

FIG. 2.1 illustrates, in partial schematic form, a standard LSDL device illustrating the static logic devices for isolating the dynamic node from the output node;

FIG. 2.2.1 illustrates, in partial schematic form, circuitry for incorporation in the logic tree of FIG. 2.1 whereby the logic function performed is the logical OR of three input signals;

FIG. 2.2.2 illustrates, in partial schematic form, another circuit for incorporation in the logic tree of FIG. 2.1 whereby the logic function performed is the logical AND of three input signals;

FIG. 2.3 illustrates a timing diagram corresponding to an embodiment of the dynamic logic device of FIG. 2.1 in which the logic function performed is the logical OR of three input signals;

FIG. 3.1 illustrates, in block diagram form, a limited switch dynamic logic system in accordance with an embodiment of the present invention;

FIG. 3.2 illustrates a two-phase clock which may be used in conjunction with the logic system of FIG. 3.1;

DETAILED DESCRIPTION

Figure 4:
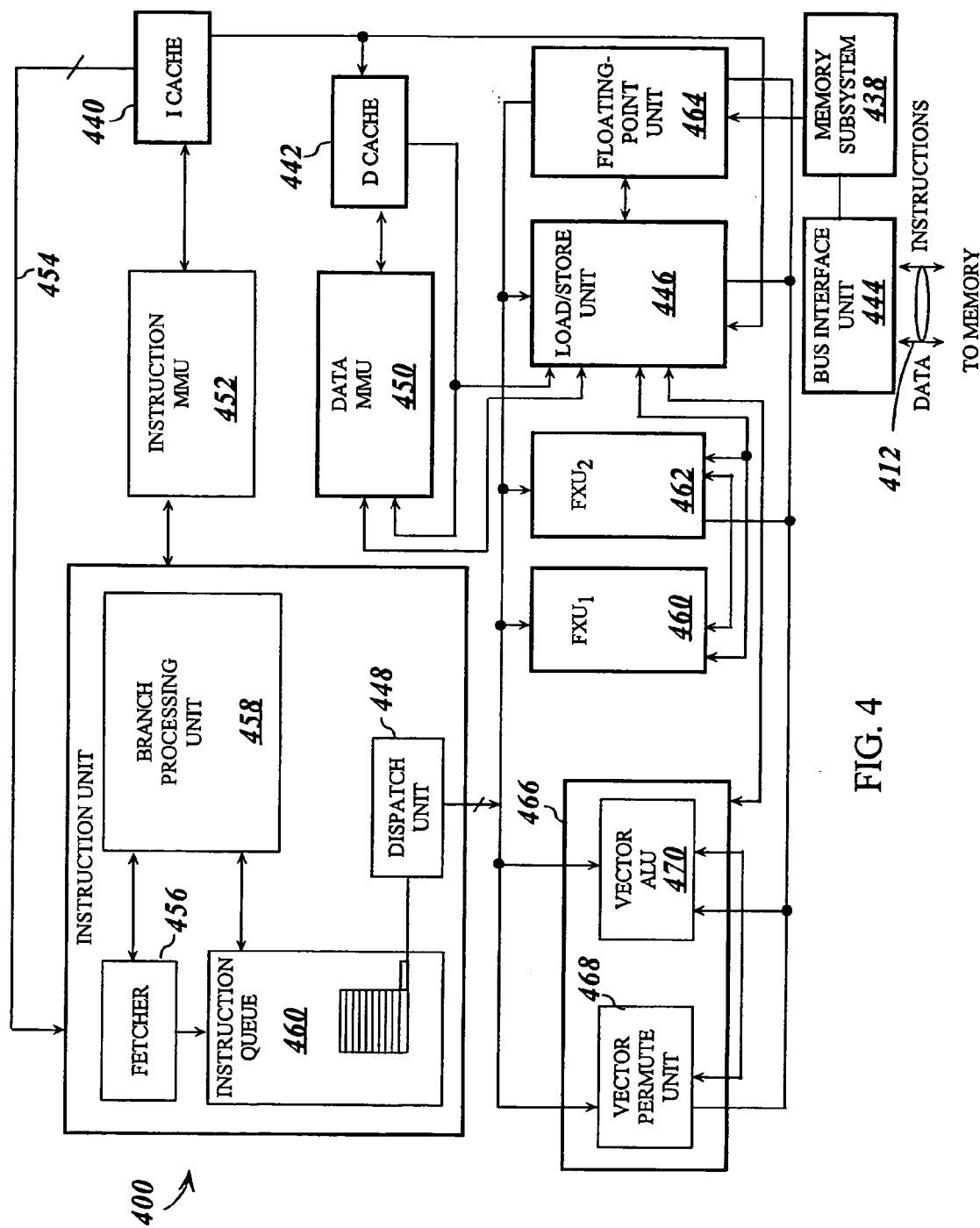
FIG. 4 illustrates a high level block diagram of selected operational blocks within a central processing unit (CPU) incorporating the present inventive principles.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, data formats within communication protocols, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 2.1 illustrates a standard limited switch dynamic logic (LSDL) device 200. In general, LSDL device 200 receives a plurality, n, of inputs 202a . . . 202f provided to logic tree 204, and outputs a Boolean combination of the inputs. The particular Boolean function performed by LSDL device 200 is reflected in the implementation of logic tree 204 (accounting for the inversion performed by the inverter formed by n-channel field effect transistor (NFET) 206 and p-channel field effect transistor (PFET) 208). Logic tree 204 is coupled between the drain of PFET 212 and the drain of NFET 214, node 216. The junction of the logic tree 204 and the drain of PFET 212 forms dynamic node 210.

For example, FIG. 2.2.1 illustrates logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression 250 in FIG. 2.2.1) and accounting for the inversion via NFET 206 and PFET 208. Similarly, FIG. 2.2.2 illustrates a logic tree 240 including three serially connected NFETs 237, 239 and 241. Logic tree 240 may be used in conjunction with the logic device 200 to generate the logical NAND of the three input signals a, b and c (as indicated by the Boolean expression 260 in FIG. 2.2.2).

Returning to FIG. 2.2.1, dynamic node 210 is coupled to the common junction of the gates of NFET 206 and PFET 208 which invert the signal on dynamic node 210. The inversion of the signal on dynamic node 210 is provided on Out 218a. The transistor pair, 206 and 208, is serially coupled to parallel NFETs 220 and 222. NFET 220 is switched by clock signal 224. Thus, during the evaluate phase of clock signal 224, the inverter pair, NFET 206 and PFET 208, are coupled between the supply rails by the action of NFET 220.

The operation of LSDL device 200 during the evaluate phase, $N_1$, may be further understood by referring to FIG. 2.3 illustrating an exemplary timing diagram corresponding to the dynamic logic circuit of FIG. 2.1 in combination with a logic tree embodiment 230 of FIG. 2.2.1. In this way, for purposes of illustration, the timing diagram in FIG. 2.3 is the counterpart to the timing diagram in FIG. 1.2 for the three-input OR gate 100 depicted in FIG. 1.1. As shown, input a is "high" or "true" between $t_1$ and $t_2$. In the evaluate phase, N, of clock signal 224, dynamic node 210 is pulled down (intervals $T_1$). In these intervals, Out 218a is held high by the action of the inverter formed by transistors 206 and 208, which inverter is active through the action of NFET 220 as previously described. In the intervening intervals, $T_2$, dynamic node 210 is pulled up via the action of the precharge phase, $N_2$ of clock signal 224, and PFET 212. In these intervals, the inverter is inactive as NFET 220 is off. Out 218a is held "high" by the action of inverter 226 and PFET 228. Note also that the output of inverter 226 may provide a complementary output, Out N 218b. (Thus, with respect to the three-input logic trees in FIGS. 2.2.1 and 2.2.2, the corresponding logic device represents a three-input OR gate and a three-input AND gate, respectively.)

Returning to FIG. 2.1, if the logic tree evaluates "high", that is the Boolean combination of inputs 202a . . . 202d represented by logic tree 204, evaluate high, whereby dynamic node 210 maintains its precharge, Out 218a is discharged via NFET 206 and NFET 220. In the subsequent precharge phase, $N_2$, of clock signal 224, Out 218a is latched via the action of inverter 226 and NFET 222. Thus, referring again to FIG. 2.3, corresponding to the three input OR embodiment of logic device 200 and logic tree 230 (FIG. 2.2.1) at $t_2$ input a falls, and in the succeeding evaluate phase of clock signal 224, dynamic node 210 is held high by the precharge. The inverter pair, NFETs 206 and 208, are active in the evaluate phase of $N_1$, of clock signal 224 because of the action of NFET 220. Consequently, Out 218a falls ($t_3$). In the succeeding precharge phase, $N_2$ of clock signal 224, Out 218a is latched in the "low" state, as previously described.

In this way, LSDL device 200 in FIG. 2.1, may provide a static switching factor on Out 218a, and likewise with respect to the complementary output Out N 218b. It would also be recognized by artisans of ordinary skill that although LSDL device 200, FIG. 2.1, has been described in conjunction with the particular logic tree embodiments of FIG. 2.2.1 and FIG. 2.2.2, the principles of the present invention apply to alternative embodiments having other logic tree implementations, and such alternative embodiments fall within the spirit and the scope of the present invention.

Note too, as illustrated in the exemplary timing diagram in FIG. 2.3, the duty factor of the clock signal may have a value that is less than fifty percent (50%). In such an embodiment, the evaluate phase, $N_1$, of the clock signal may be shorter in duration than the precharge phase, $N_2$. A clock signal having a duty factor less than fifty percent (50%) may be referred to as a pulse (or pulsed) clock signal. Note that a width of the evaluate phase may be sufficiently short that leakage from the dynamic node may be inconsequential. That is, leakage does not affect the evaluation of the node.

In such a clock signal embodiment, the size of the precharge device (PFET 212 in the embodiment of FIG. 2.1) may be reduced. It would be recognized by those of ordinary skill in the art that a symmetric clock signal has a fifty percent (50%) duty cycle; in an embodiment in which the duty cycle of the clock signal is less than fifty percent (50%), the size of the precharge device may be reduced concomitantly. In particular, an embodiment of the present invention may be implemented with a clock signal duty cycle of approximately thirty percent (30%). Additionally, while logic device 200 has been described from the perspective of "positive" logic, alternative embodiments in accordance with the present inventive principles may be implemented in the context of "negative" logic and such embodiments would also fall within the spirit and scope of the present invention.

FIG. 3.1 illustrates a portion 300 of a data processing system incorporating LSDL circuits in accordance with the present inventive principles. System portion 300 may be implemented using a two-phase clock signal (denoted clock 1 and clock 2). A timing diagram which may be associated with system portion 300 will be discussed in conjunction with FIG. 3.2. LSDL blocks 302b that may be clocked by a second clock signal phase, clock 2, alternates with LSDL block 302a clocked by the first clock signal phase, clock 1. Additionally, system portion 300 may include static logic elements 304 between LSDL blocks. Typically, static circuit blocks 304 may include gain stages, inverters or static logic gates. Static circuit blocks 304 are differentiated from LSDL blocks 302a and 302b as they do not have dynamic nodes that have a precharge cycle. However, alternative embodiments may include any amount of static logic. Additionally, as previously mentioned, an embodiment of system portion 300 may be implemented without static circuit blocks 304.

FIG. 3.2 illustrates a timing diagram which may correspond to a logic system employing a two-phase, pulsed clock signal, such as system portion 300, FIG. 3.1, in accordance with the present inventive principles. The LSDL circuits evaluate during the LSDL evaluate, or drive, portion 306 of their respective clock signals. As previously described, the duty factor of each of clock 1 and clock 2 may be less than fifty percent (50%). The width of the LSDL drive portions 306 of the clock signals need only be sufficiently wide to allow the evaluate node (such as dynamic node 210, FIG. 2.1) to be discharged through the logic tree (for example logic tree 204, FIG. 2.1). As previously described, the duration of the drive portion may be sufficiently narrow that leakage from the evaluation may be inconsequential. Consequently, LSDL circuits are not particularly sensitive to the falling edge of the clock signals, and in FIG. 3.2, the falling portion of the evaluate phase 306 of the clock signals has been depicted with cross-hatching. As noted herein above, the duty factor of clock 1 and clock 2 may be approximately thirty percent (30%) in an exemplary embodiment of the present invention. (It would be appreciated, however, that the present inventive principles may be incorporated in alternative embodiments which have other duty factors.) During the precharge portion 308 of the clock signals, the dynamic node (for example, dynamic node 210, FIG. 2.1) is precharged, as previously discussed. Clock 2 is 180° ($\pi$ radians) out of phase with clock 1 (shifted in time one-half of period T). Thus as shown, the evaluate portion 306 of clock 2 occurs during the precharge phase 308 of clock 1. Because in LSDL circuits, the output states may not change during the evaluate phase of the driving clock signal; the inputs to LSDL blocks, for example, LSDL blocks 302b, FIG. 3.1, are stable during the evaluate phase of the corresponding driving clock signal, clock 2. The time interval, between the end of the evaluate portion 306 of clock 1 and the rising edge of clock 2 may be established by the setup time of the LSDL, and the evaluation time of the static blocks, if any (for example, static blocks 304, FIG. 3.1). The time, Tau 301, together with duty factor may determine the minimum clock signal period for a particular LSDL circuit implementation. Thus, a system portion 300, FIG. 3.1 having a two-phase clock signal effects two dynamic evaluations per period, T, of the driving clock signals. It would be further appreciated by those of ordinary skill in the art that, in general, the present inventive principles may be incorporated in alternative embodiments of an LSDL system having a plurality, n, of clock signal phases. Such alternative embodiments would fall within the spirit and scope of the present invention.

An LSDL system in accordance with the principles of the present invention, such as system 300, FIG. 3.1, may be used, in an exemplary embodiment, in an arithmetic logic unit (ALU). A typical ALU architecture requires a significant number of exclusive-OR (XOR) operations. The XOR of two Boolean values requires having both senses of each of the Boolean values, that is, both the value and its complement ($a \oplus b = ab' + a'b$). As previously described, use of dual rail dynamic logic to implement such functionality obviates the advantages in area and power otherwise obtained by dynamic logic. A data processing system, including an ALU embodying the present inventive principles, is illustrated in FIG. 4.

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 450 and instruction MMU 452. In the depicted architecture, CPU 400 operates on data in response to instructions retrieved from I-cache 440 through instruction dispatch unit 448. Dispatch unit 448 may be included in instruction unit 454 which may also incorporate fetch unit 456 and branch processing unit 458 which controls instruction branching. An instruction queue 460 may interface fetch unit 456 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. VALU 470 may be implemented using LSDL in accordance with the present inventive principles, and in particular may incorporate LSDL logic systems, of which LSDL system 300, FIG. 3.1 is exemplary.

Figure 5:
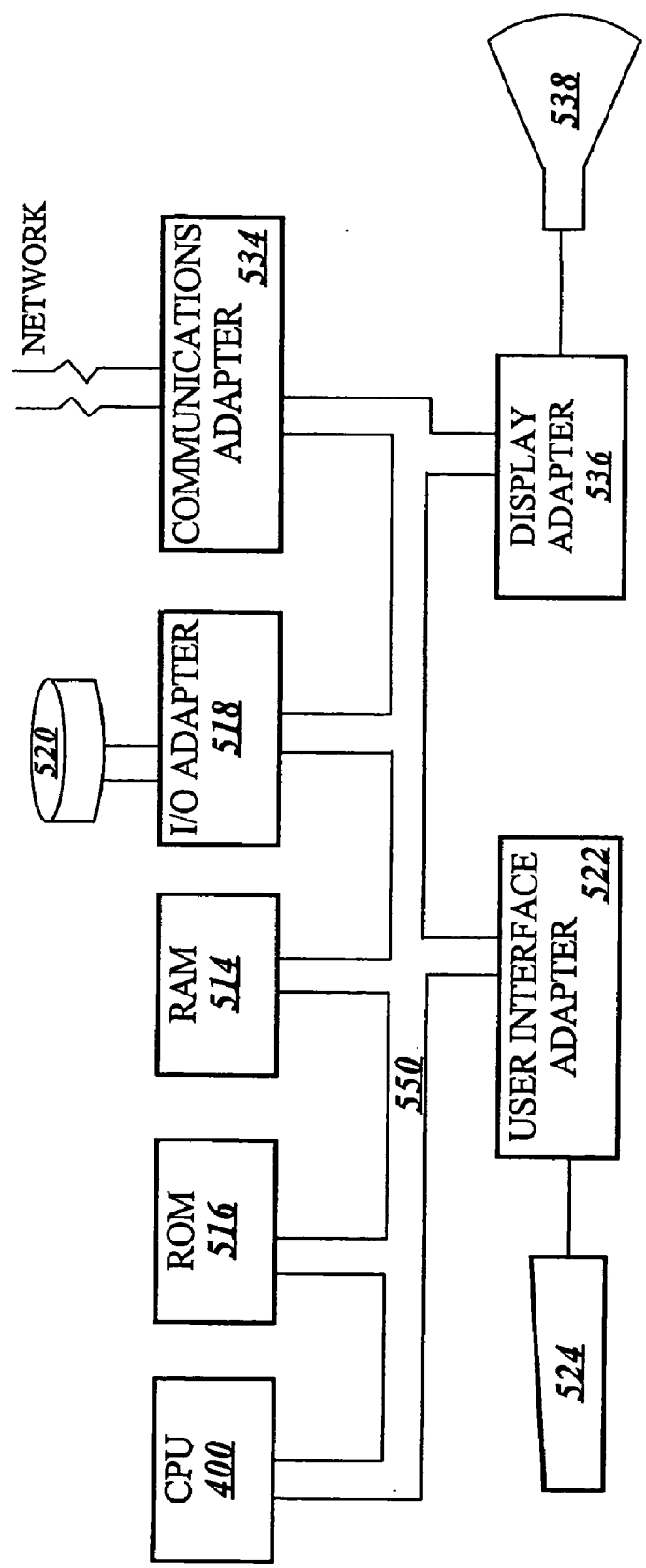
FIG. 5 illustrates a data processing system configured in accordance with the present invention.

A representative hardware environment 500 for practicing the present invention is depicted in FIG. 5, which illustrates a typical hardware configuration of a data processing system in accordance with the subject invention having CPU 400, incorporating the present inventive principles, and a number of other units interconnected via system bus 550. The data processing system shown in FIG. 5 includes random access memory (RAM) 514, read only memory (ROM) 516, and input/output (I/O) adapter 518 for connecting peripheral devices such as disk units 520 to bus 550, user interface adapter 522 for connecting keyboard 524, mouse 526, and/or other user interface devices such as a touch screen device (not shown) to bus 550, communication adapter 534 for connecting the system to a data processing network, and display adapter 536 for connecting bus 550 to display device 538. Note that CPU 400 may reside on a single integrated circuit.

Figure 6:
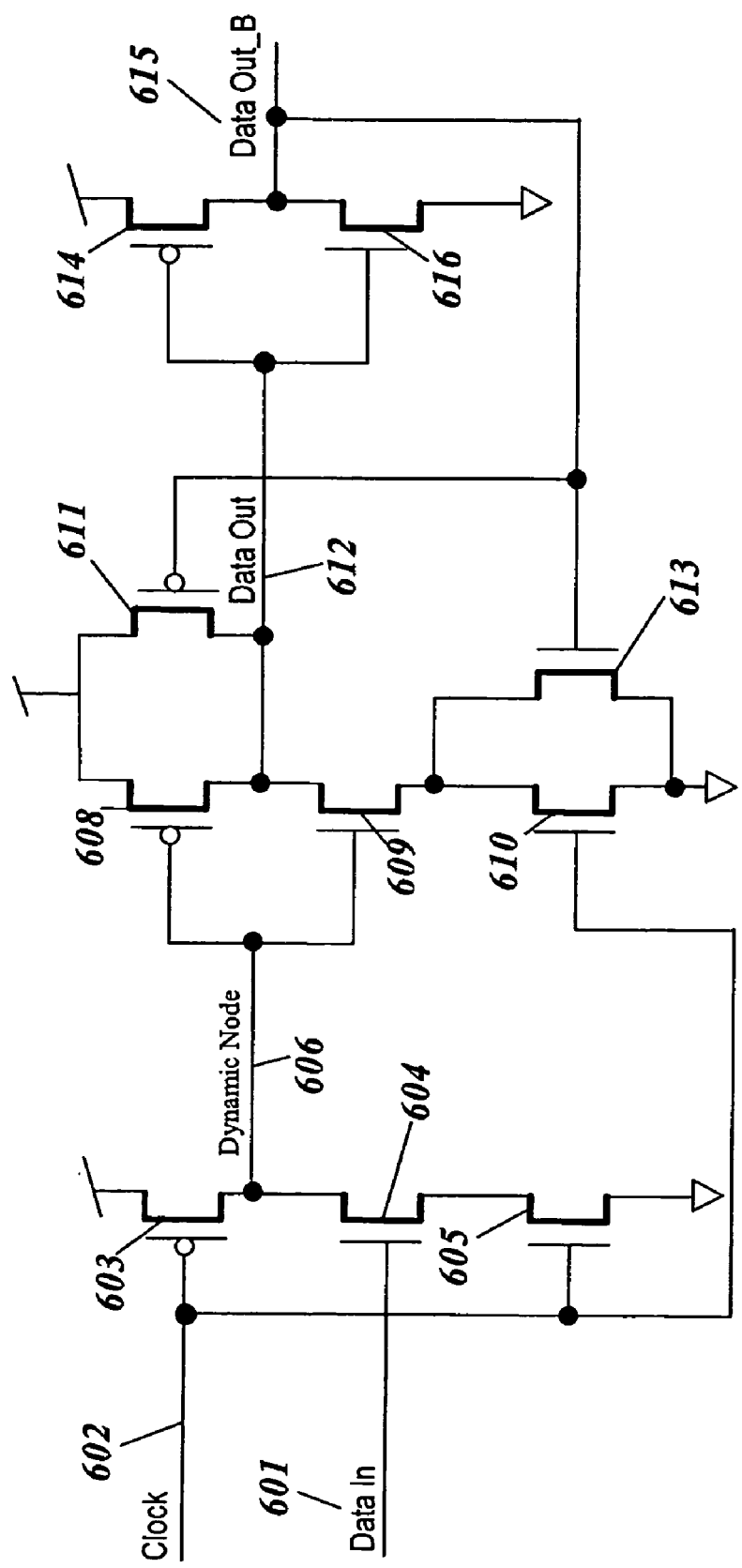
FIG. 6 is a circuit diagram of a standard LSDL buffer.

FIG. 6 is the circuit for a standard LSDL buffer with clock 602 and Data In 601. PFET 603 is the pull-up used to pre-charge dynamic node 606 when the clock is logic zero. NFET 604 generates the logic state of Data In 601 and NFET 605 asserts this logic state on dynamic node 606 when clock 602 is a logic one. The logic state of the dynamic node is inverted by PFET 608 and NFET 609. If the dynamic node asserts to a logic zero, PFET 608 turns ON and Data Out 612 transitions to a logic one and Data Out_B transitions to a logic zero. When Data In 601 is a logic one, the logic one state at Data Out 612 is latched by action of PFET 611 and the logic zero state of Data Out_B 615. When Data In 601 is a logic zero, dynamic node 606 asserts to a logic one and this logic state is inverted to a logic zero at Data Out 612 by the action of NFET 609 and NFET 610 when clock 602 transitions to a logic one. Data Out_B transitions to a logic one and the logic zero of Data Out 612 is latched by the action of NFET 613 and the logic one state of Data Out_B.

Figure 7:
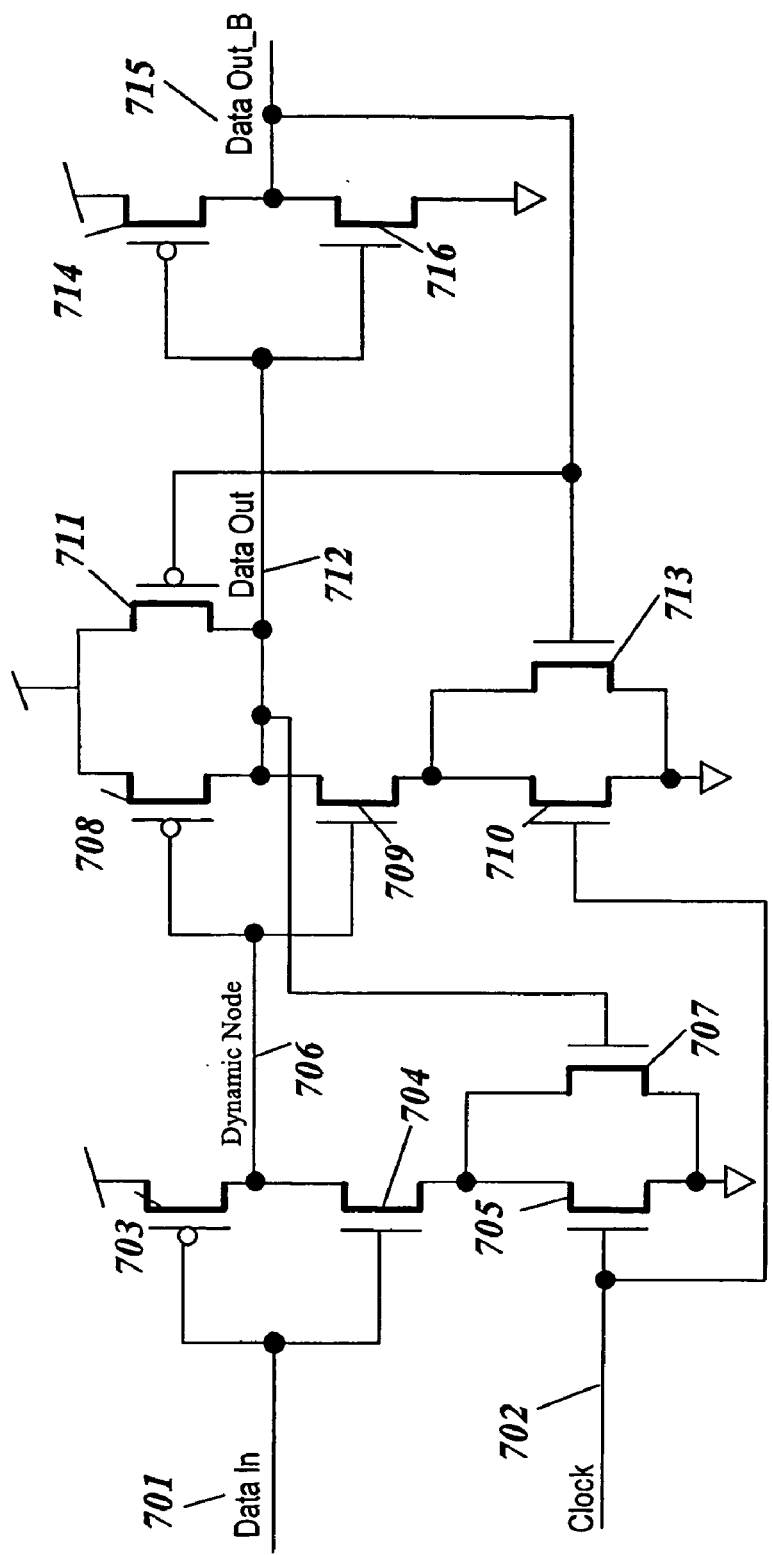
FIG. 7 is a circuit diagram of an LSDL buffer according to embodiments of the present invention.

FIG. 7 is the circuit of the improved LSDL buffer with reduced switching power according to embodiments of the present invention. In this embodiment, Data In 701 is coupled to the gates of PFET 703 and NFET 704 and clock 702 is coupled only to the gates of NFET 705 and NFET 710. In this embodiment, dynamic node 706 is pre-charged to a logic one when Data In 701 is a logic zero. Therefore the switching of PFET 703 is reduced to the switching of Data In 701 which must always be lower than the switching of clock 702. Since the size of pre-charge PFET 703 cannot be a small because of typical constraints, small cycle time, duty cycle, and greater clock uncertainties, reducing its switching rate results in significant power savings.

The function of the dynamic node 706 is now keyed to the switching nature of Data In 701. Since an assumption regarding dynamic logic is that, on average, a logic signal is a logic one 50% of the time and a logic zero 50% of the time, then this aspect of the dynamic node 706 does not change. However, the rate of switching of PFET 703 does change because we do not expect Data In 701 to change at the frequency of the clock 702. As with standard LSDL, when clock 702 transitions to a logic one, the state of NFET 704 either leaves dynamic node 706 at a logic one (Data In 701 is a logic zero), or pulls dynamic node 706 to a logic zero if Data In 701 is a logic one.

When clock 702 transitions to a logic one, LSDL buffer 700 starts the evaluate phase. If Data In 701 is a logic one, PFET 703 is OFF, NFET 704 is ON and dynamic node 706 evaluates to a logic zero. Since clock 702 is a logic one, NFET 710 is ON and the inverting action of PFET 708 and NFET 709 is enabled. Therefore, Data Out 712 transitions to a logic one (follows Data In 701). PFET 714 and NFET 716 form another inverter generating Data Out_B 715 (inversion of Data In 701). When Data Out 712 transitions to a logic one, Data Out_B 715 transitions to a logic zero. Data Out_B 715 turns on PFET 711 which latches the logic one state of Data Out 712.

If Data In 701 is a logic zero, NFET 704 is OFF, PFET 703 is ON and dynamic node 706 is charged to a logic one and NFET 709 turns ON. When clock 702 transitions to a logic one, NFET 710 turns ON and Data Out 712 transitions to a logic zero and Data Out_B transitions to a logic one. Keeper PFET 711 turns OFF and NFET 713 turns ON latching the logic zero of Data Out 712.

When clock 702 transitions to a logic zero, LSDL buffer 700 starts the pre-charge phase. When clock 702 is low, NFET 705 is OFF, therefore the pull-down path of NFETs 704 and 705 is OFF independent of the logic state of Data In 701. If Data In 701 is a logic one, PFET 703 is also OFF, and dynamic node 706 remains at a logic zero when Data Out 712 is logic one and Data Out_B 715 is a logic zero. Therefore, no unnecessary internal switching occurs. If Data In 701 is a logic zero, NFET 704 is OFF, therefore dynamic node 706 can charge to a logic one.

Dynamic node 706 should have two stable states, logic one and a logic zero. However, with Data In 701 taking on the role of controlling the pre-charge phase, LSDL buffer 700 would have an unstable state without the addition of NFET 707. If dynamic node 706 was asserted as a logic zero on a previous clock cycle and then Data In 701 transitions to a logic one, then dynamic node 706 would float (unstable state) during a period when clock 702 is a logic zero since both the pull-up path and the pull down path would both be OFF. However, when dynamic node 706 asserts to a logic zero, Data Out 712 is latched to a logic one. By coupling the gate of NFET 707 with Data Out 712, NFET 707 is turned ON when Data Out 712 is a logic one. Now when dynamic node 706 asserts to a logic zero and Data In 701 goes to a logic one, NFET 707 and NFET 704 assures this logic zero state of dynamic node 706 is stable when clock 702 transitions to a logic zero.

Figure 8:
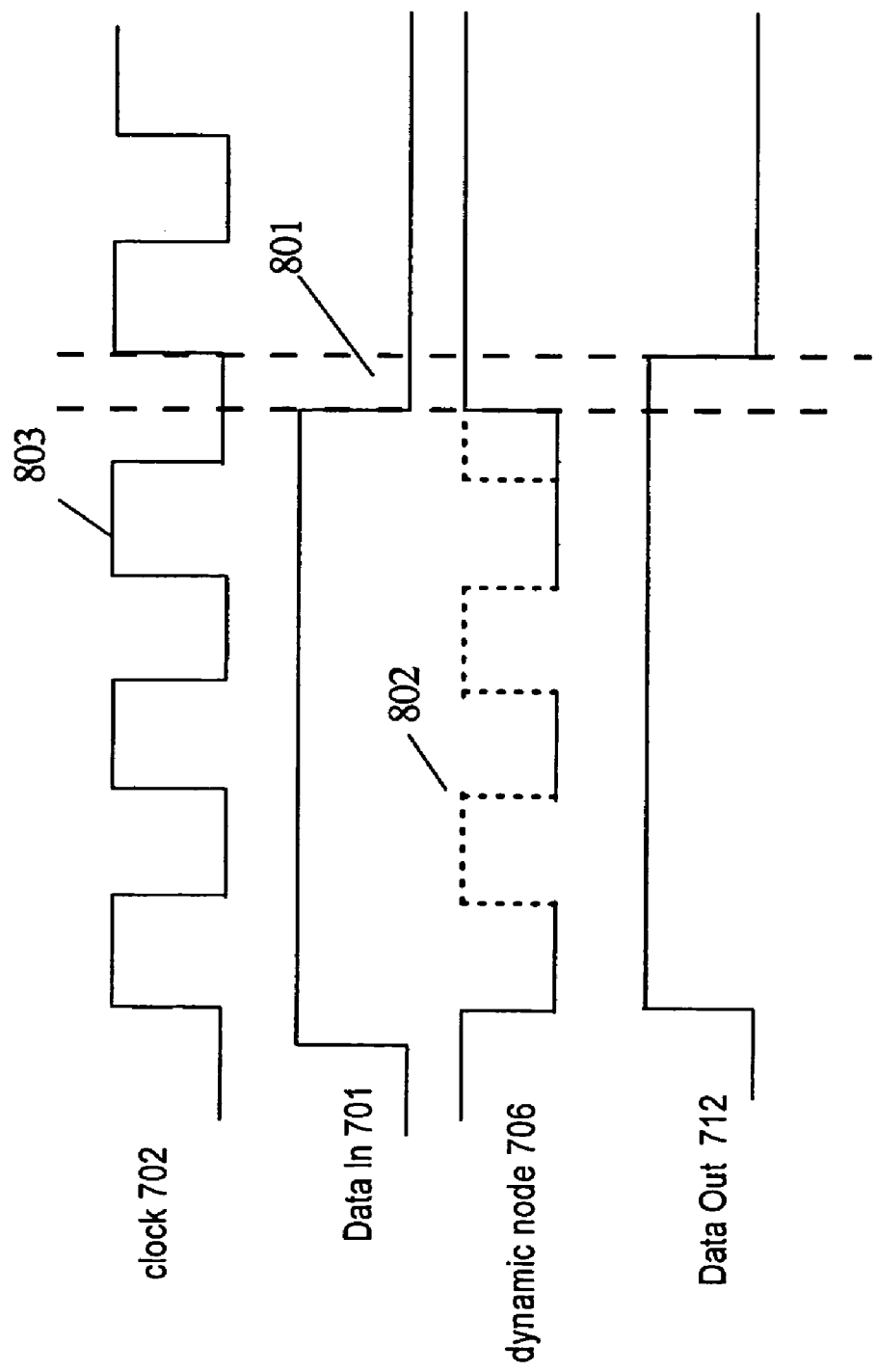
FIG. 8 is a timing diagram of the LSDL buffer in FIG. 7 when the data input changes state infrequently.

FIG. 8 is a timing diagram of cycles of signals of the embodiment of FIG. 7 during a stable period where Data In 701 does not change for several cycles of clock 702. The evaluate phase occurs when clock 702 is a logic one (e.g., period 803). The pre-charge phase occurs when Data In 701 transitions to a logic zero (e.g., period 801). The dotted lines 802 illustrate the transitions that would occur in the LSDL buffer in FIG. 6. When Data In 701 remains a logic one, the conventional LSDL circuit 600 undergoes several full-rail transitions while the LSDL buffer 700 does not switch. Therefore LSDL buffer 700 realizes significant power savings for non-changing input data patterns.

When LSDL buffer 700 is used in high-performance logic circuits, for instance, in a single data input bit embodiment of a N-bit wide dataflow image, the total amount of clock load reduction becomes significant (i.e., N times the capacitance of the pre-charge PFET plus wiring) thereby substantially reducing the size of the clock circuitry needed to provide the clock distribution. Such data latching, conversion from dynamic to static logic domains, and data forwarding in physical space are very common occurrences in high-speed logic designs. The present invention works efficiently and yet saves both the switching and clock power conveniently without undergoing other topology changes.

PFET 703 and NFETs 704, 705 and 707 form the dynamic portion of LSDL buffer 700. Dynamic node 706 generates a logic signal that is asserted in response to logic states of Clock 702 or the feedback signal coupled to the gate of NFET 707. In general, the logic signal on the dynamic node 706 is either a logic true or a logic false Boolean combination of one or more input signals. In the case of buffer 700 there is only one input signal, Data In 701 which is a logic true (logic one) or a logic false (logic zero). Since the logic true state is a logic one, the dynamic node is pre-charged to a logic one (logic true) when Data In 701 is a logic false (logic zero).

Figure 9:
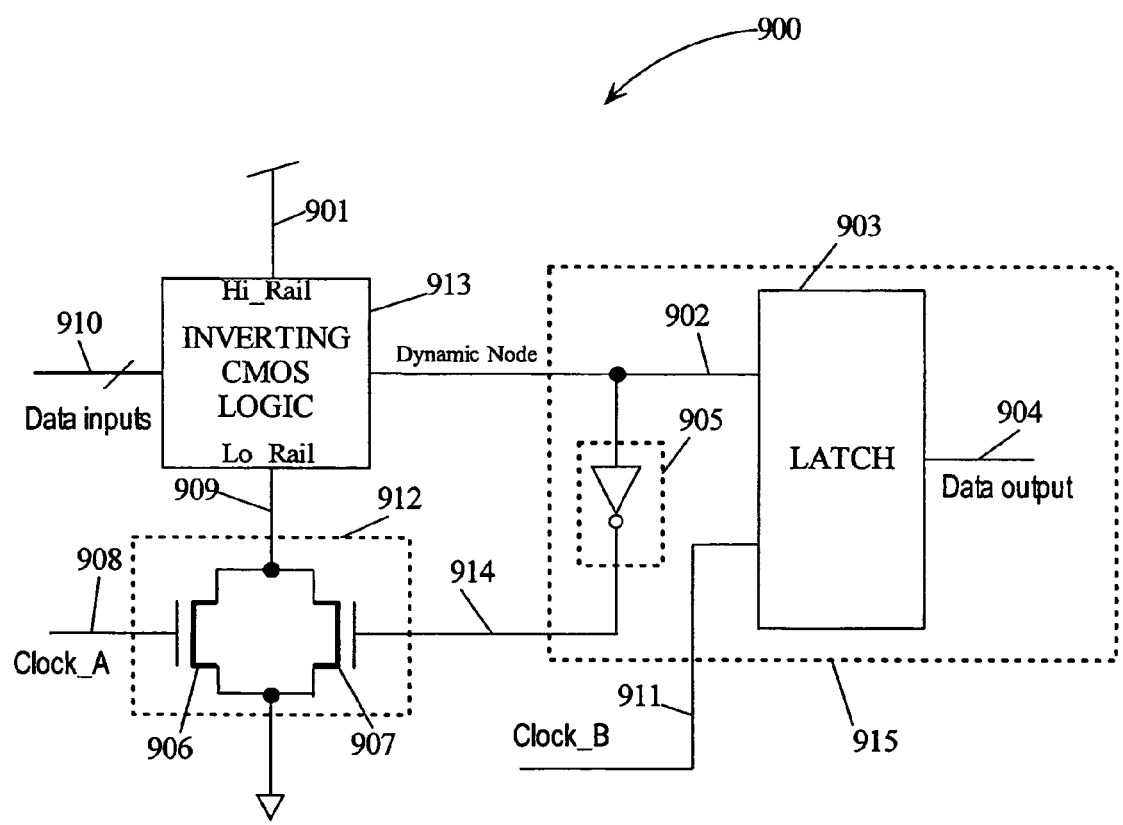
FIG. 9 is a generalized circuit diagram of embodiments of the present invention.

FIG. 9 is a generalized LSDL circuit 900 according to embodiments of the present invention. Inverting complementary metal oxide silicon (CMOS) logic 913 receives one or more Data Inputs 910. If Data Inputs 910 comprises only one input, then this circuit of FIG. 9 is reduced to the LSDL buffer 700 in FIG. 7. Inverting CMOS logic 913 implements a logic function F such that if the states of Data Inputs 910 are such that F generates a logic true state, then dynamic node 902 is coupled to Lo_Rail 909. Likewise any combination of Data Inputs 910 that cause F to generate a logic false state, then dynamic node 902 is coupled to Hi_Rail 913 and the dynamic node 902 is charged to a logic one. With this functionality, inverting CMOS logic 913 pre-charges dynamic node 902 in response to states of the Data Inputs 910 and not Clock_A 908. Dynamic node 902 is evaluated when Clock _A 908 transitions to a logic one turning NFET 906 ON or when feedback signal 914 is a logic one. Clock_B 911 is used to latch the evaluated logic state of dynamic node 902 in Latch 903 generating Data Output 904. Since dynamic node 902 is pre-charged only when F is a logic zero (false) switching on dynamic node 902 is reduced as was the case for LSDL buffer 700 when the logic states of Data In 910 generated a logic true for an extended time period. If Clock _A 908 and Clock_B 911 are the same signal, then the clock is only coupled to two devices for circuit 900, wherein a standard LSDL implementation of the function would couple the clock to three devices, one PFET and two NFETs. Whenever dynamic node 902 has asserted to a logic zero, "keeper" NFET 905 is turned ON by inverter 905 (feedback signal 914). In circuit 900, inverter 905 is a static device external to latch 903. However, the function of inverter 905 may be incorporated into latch 903 and may be dynamic and clocked by Clock_B 911. Most CMOS logic circuits are inverting by the nature of their circuit topology, for example, NOR circuits and NAND circuits. Other circuits that do not naturally invert may employ a complementary inverter as the last stage. The circuit of FIG. 9 illustrates that the power savings realized in the improved LSDL buffer 700 may be realized with any arbitrary CMOS logic function by incorporating a clocked pull-down evaluation NFET (e.g., NFET 906) in parallel with a keeper NFET 907 wherein the dynamic node is pre-charged when the function of the arbitrary CMOS logic function is a false (coupling the dynamic node 902 to Hi_Rail 901) and evaluated when the Clock_A 908 is a logic one by turning ON NFET 906. Since the static latch portion (Latch 903) of LSDL generates both the signal and its complement, adding an inverting stage as the last stage of an arbitrary logic function to generate an Inverting CMOS logic 913 allows the correct logic state to be realized.

In the embodiment of FIG. 9, the dynamic portion of LSDL circuit 900 comprises inverting CMOS logic 913 and NFETs 906 and 907. Data Inputs 910 comprise multiple signals. This dynamic portion of LSDL circuit 900 evaluates a Boolean function of the Data Inputs 910 and generates a logic signal on dynamic node 902. The logic signal on dynamic node 902 is asserted in response to a logic one on Clock_A 908 or feedback signal 914. Since CMOS logic 913 is inverting, the output is a logic zero when the input conditions (logic states of Data Inputs 910) are satisfied (Boolean combination is a logic true). Therefore, the dynamic node is pre-charged to logic one when the Data Inputs 910 have any of possible logic false Boolean combinations. If the Data Inputs 910 remain in a logic false Boolean combination, then the logic one of dynamic node 902 will be latched into static portion 915. If Data Inputs 910 are in a logic true Boolean combination, dynamic node 902 will transition to a logic zero when Clock_A 908 is a logic one or feedback 914 is a logic one.

Although the present invention and its advantages have been described in detail, it should be understood that various changes, substitutions and alterations can be made herein without departing from the spirit and scope of the invention as defined by the appended claims.

What is claimed is:

1. A logic circuit comprising:

a dynamic logic portion for evaluating a Boolean function of one or more input signals, wherein a logic signal on a dynamic node, asserted in response to a first logic state of a first clock signal or a first logic state of a feedback signal, comprises either a logic true or a logic false Boolean combination of the one or more input signals and wherein the dynamic node is pre-charged to the first logic state corresponding to the logic false Boolean combination of the one or more input signals when the one or more input signals have any of possible logic false Boolean combinations; and a static portion coupled to the dynamic node and generating the feedback signal in response to the logic signal and generating a latched data output signal in response to the logic signal and a second clock signal.

2. The logic circuit of claim 1 further generating an inverted data output signal as the logic inversion of the latched data output signal.

3. The logic circuit of claim 1, wherein the first clock signal and the second clock signal are the same signal.

4. The logic circuit of claim 1, wherein the feedback signal is the latched data output signal.

5. The logic circuit of claim 1, wherein the feedback signal is generated as a logic inversion of the logic signal.

6. The logic circuit of claim 1, wherein the dynamic portion comprises:
an inverting complementary logic circuit having a first power node coupled to first power supply voltage, an evaluate node, one or more inputs receiving the one or more input signals, and the dynamic node; and
an evaluate circuit having a clock node receiving the first clock signal, a feedback node receiving the feedback signal, a second power node coupled to a second power supply voltage, and a common node coupled to the evaluate node.

7. The logic circuit of claim 6, wherein the inverting complementary logic comprises:
one or more PFETs each having a source, a drain, and a gate coupled to a corresponding one of the plurality of input signals, wherein at least one PFET source of the one or more PFETs is coupled to the first power node, at least one PFET drain of the one or more PFETs is coupled to the dynamic node and the one or more PFETs couple the first power node to the dynamic node in response to a logic false Boolean combination of the one or more input signals; and
one or more NFETs each having a source, a drain, and a gate coupled to a corresponding one of the plurality of input signals, wherein at least one NFET drain of the one or more NFETs is coupled to the dynamic node, at least one of the NFET source of the one or more NFETs is coupled to the evaluate node and the one or more NFETs couple the dynamic node to the evaluate node in response to a logic true Boolean combination of the one or more input signals.

8. The logic circuit of claim 7, wherein the evaluate circuit comprises:
a first NFET having a source coupled to the second power supply node, a drain coupled to the common node and a gate coupled to the first clock signal; and
a second NFET having a source coupled to the second power supply node, a drain coupled to the common node, and a gate coupled to the latched data output signal.

9. The logic circuit of claim 7, wherein the evaluate circuit comprises:
a first NFET having a source coupled to the second power supply node, a drain coupled to the common node and a gate coupled to the first clock signal;
a second NFET having a source coupled to the second power supply node, a drain coupled to the common node and a gate; and
an inverter having an input coupled to the dynamic node and an output coupled to the gate of the second NFET.

10. The logic of claim 2 wherein the static portion includes:
a first PFET having a gate coupled to the dynamic node, a source coupled to the first power supply voltage and a drain;
a first NFET having a gate coupled to the gate of the first PFET, a drain coupled to the drain of the first PFET forming a data output node generating the latched data output signal, and a source;
a second NFET having a gate coupled to the second clock signal, a source coupled to the second power supply voltage and a drain coupled to the source of the first NFET;
a third NFET having a drain coupled to the drain of the second NFET, a source coupled to the second power supply voltage and a gate;
an inverting circuit having an input coupled to the data output node, an output node coupled to the gate of the third NFET and generating the inverting data output signal; and
a second PFET having a gate coupled to the output node of the inverting circuit, a drain coupled to the data output node, and a source coupled to the first power supply voltage.

11. A data processing system comprising:
a central processing unit (CPU); and
a memory operable for communicating instructions and operand data to said CPU, wherein said CPU includes a logic system having a logic circuit with a dynamic logic portion for evaluating a Boolean function of one or more input signals, wherein a logic signal on a dynamic node, asserted in response to a first logic state of a first clock signal or the first logic state of a feedback signal, comprises either a logic true or a logic false Boolean combination of the one or more input signals and wherein the dynamic node is pre-charged to the first logic state corresponding to the logic false Boolean combination of the one or more input signals when the one or more input signals have any of possible logic false Boolean combinations; and a static portion coupled to the dynamic node and generating the feedback signal in response to the logic signal and generating a latched data output signal in response to the logic signal and a second clock signal.

12. The data processing system of claim 11 further generating an inverted data output signal as the logic inversion of the latched data output signal.

13. The data processing system of claim 11, wherein the first clock signal and the second clock signal are the same signal.

14. The data processing system of claim 11, wherein the feedback signal is the latched data output signal.

15. The data processing system of claim 11, wherein the feedback signal is generated as a logic inversion of the logic signal.

16. The data processing system of claim 11, wherein the dynamic portion comprises:
an inverting complementary logic circuit having a first power node coupled to first power supply voltage, an evaluate node, one or more inputs receiving the one or more input signals, and the dynamic node; and
an evaluate circuit having a clock node receiving the first clock signal, a feedback node receiving the feedback signal, a second power node coupled to a second power supply voltage, and a common node coupled to the evaluate node.

17. The data processing system of claim 16, wherein the inverting complementary logic comprises:
one or more PFETs each having a source, a drain, and a gate coupled to a corresponding one of the plurality of input signals, wherein at least one PFET source of the one or more PFETs is coupled to the first power node, at least one PFET drain of the one or more PFETs is coupled to the dynamic node and the one or more PFETs couple the first power node to the dynamic node in response to a logic false Boolean combination of the one or more input signals; and one or more NFETs each having a source, a drain, and a gate coupled to a corresponding one of the plurality of input signals, wherein at least one NFET drain of the one or more NFETs is coupled to the dynamic node, at least one of the NFET source of the one or more NFETs is coupled to the evaluate node and the one or more NFETs couple the dynamic node to the evaluate node in response to a logic true Boolean combination of the one or more input signals.

18. The data processing system of claim 17, wherein the evaluate circuit comprises:

a first NFET having a source coupled to the second power supply node, a drain coupled to the common node and a gate coupled to the first clock signal; and a second NFET having a source coupled to the second power supply node, a drain coupled to the common node, and a gate coupled to the latched data output signal.

19. The data processing system of claim 17, wherein the evaluate circuit comprises:

a first NFET having a source coupled to the second power supply node, a drain coupled to the common node and a gate coupled to the first clock signal;

a second NFET having a source coupled to the second power supply node, a drain coupled to the common node and a gate; and an inverter having an input coupled to the dynamic node and an output coupled to the gate of the second NFET.

20. The logic of claim 12 wherein the static portion includes:

a first PFET having a gate coupled to the dynamic node, a source coupled to the first power supply voltage and a drain;

a first NFET having a gate coupled to the gate of the first PFET, a drain coupled to the drain of the first PFET forming a data output node generating the latched data output signal, and a source;

a second NFET having a gate coupled to the second clock signal, a source coupled to the second power supply voltage and a drain coupled to the source of the first NFET;

a third NFET having a drain coupled to the drain of the second NFET, a source coupled to the second power supply voltage and a gate;

an inverting circuit having an input coupled to the data output node, an output node coupled to the gate of the third NFET and generating the inverting data output signal; and a second PFET having a gate coupled to the output node of the inverting circuit, a drain coupled to the data output node, and a source coupled to the first power supply voltage.

* * * * *